(12) United States Patent
Johnson

(10) Patent No.: US 8,086,211 B2
(45) Date of Patent: Dec. 27, 2011

(54) MAGNETICALLY DIFFERENTIAL INPUT

(75) Inventor: Richard A. Johnson, Buda, TX (US)

(73) Assignee: Silicon Laboratories Inc., Austin, TX (US)

( * ) Notice: Subject to any disclaimer, the term of this patent is extended or adjusted under 35 U.S.C. 154(b) by 449 days.

(21) Appl. No.: 12/423,048

(22) Filed: Apr. 14, 2009

(65) Prior Publication Data

US 2009/0197559 A1 Aug. 6, 2009

Related U.S. Application Data

(62) Division of application No. 10/814,606, filed on Mar. 31, 2004, now Pat. No. 7,536,161.

(51) Int. Cl.
*H04B 1/28* (2006.01)
(52) U.S. Cl. ............ 455/333; 455/67.13; 455/260; 330/151; 331/108 C
(58) Field of Classification Search .......... 455/67.13, 455/240.1, 250–260, 295, 296, 323, 333, 455/334, 341; 330/52, 151; 331/10, 108 C
See application file for complete search history.

(56) References Cited

U.S. PATENT DOCUMENTS

| | | | | |
|---|---|---|---|---|
| 5,357,051 A | | 10/1994 | Hwang | 174/33 |
| 5,610,554 A | * | 3/1997 | Anvari | 330/52 |
| 5,877,653 A | * | 3/1999 | Kim et al. | 330/149 |
| 6,172,560 B1 | * | 1/2001 | Yamashita et al. | 330/52 |
| 6,255,903 B1 | * | 7/2001 | Leffel | 330/51 |
| 6,433,272 B1 | | 8/2002 | Buhler et al. | 174/27 |
| 6,570,427 B2 | | 5/2003 | Prentice | 327/287 |
| 6,624,699 B2 | | 9/2003 | Yin et al. | 330/260 |
| 6,822,817 B2 | | 11/2004 | Chung et al. | 360/46 |
| 6,867,658 B1 | | 3/2005 | Sibrai et al. | 331/185 |
| 7,120,217 B2 | * | 10/2006 | Schwarzmueller | 375/376 |
| 7,126,421 B2 | * | 10/2006 | Gurvich et al. | 330/151 |
| 2003/0042979 A1 | * | 3/2003 | Gurvich et al. | 330/151 |
| 2003/0064738 A1 | * | 4/2003 | Posner et al. | 455/503 |
| 2003/0199257 A1 | * | 10/2003 | Wilkinson et al. | 455/127.1 |
| 2005/0162221 A1 | | 7/2005 | Barnett et al. | 327/563 |
| 2005/0242886 A1 | | 11/2005 | Johnson | 330/301 |

FOREIGN PATENT DOCUMENTS

DE 27 38 129 A1 3/1979

OTHER PUBLICATIONS

European Patent Office, Communication pursuant to Article 94(3) EPC dated Nov. 27, 2008 in related foreign patent application.
State Intellectual Property Office, P.R. China, First Office Action dated Oct. 10, 2008 in related foreign patent application.
Examination Report issued by the Intellectual Property Office of Singapore on Apr. 21, 2008, pp. 1-9.

(Continued)

*Primary Examiner* — Nhan Le
(74) *Attorney, Agent, or Firm* — Trop, Pruner & Hu, P.C.

(57) ABSTRACT

A magnetically differential input circuit is arranged to define at least two loops, wherein each of the loops traverses the input of a receiving circuit. The loops are physically arranged so that a source of interference induces opposing signals in the loops, thereby effecting cancellation of the interference at the input of the receiving circuit. In one embodiment, the input circuit is arranged to be electrically differential as well as magnetically differential.

19 Claims, 3 Drawing Sheets

OTHER PUBLICATIONS

Danish Patent and Trademark Office Search Report with Written Opinion dated Jun. 21, 2007, pp. 1-15.

PCT/US2005/009752 International Search Report with Written Opinion of the International Searching Authority Mailed Oct. 21, 2005.

State Intellectual Property Office, P.R. China, Fourth Office Action issued Apr. 26, 2011 in Chinese application No. 200580010379.3.

The State Intellectual Property Office of the People's Republic of China, Third Office Action dated May 21, 2010 in Chinese Patent Application No. 200580010379.3, with English translation.

* cited by examiner

MAGNETICALLY DIFFERENTIAL INPUT

This application is a divisional of U.S. patent application Ser. No. 10/814,606 filed Mar. 31, 2004 now U.S. Pat. No. 7,536,161 entitled "MAGNETICALLY DIFFERENTIAL INPUT," the content of which is hereby incorporated by reference.

FIELD OF THE INVENTION

The invention relates generally to the design of integrated circuit devices and, more particularly, to an input circuit that effects cancellation of an interfering signal at the input of a receiving device.

BACKGROUND

Remarkable growth in the demand for communications products and services, and especially in the requirements for portable communications devices, has driven consumer requirements for low-cost, small-form-factor, low-power RF (radio frequency) transceivers. In addition, the development of state-of-the-art wireless applications has encouraged consumers to expect both the convenience of extended connectivity and the benefit of enhanced services. RF transceivers that operate in compliance with multiple prevailing standards are instrumental, if not required, in the satisfaction of these objectives. In this regard, the capabilities of CMOS (complementary metal/oxide/semiconductor) and BiCMOS (bipolar/CMOS) VLSI (very large scale integration) technology are particularly well suited to the accommodation of very aggressive levels of mixed-signal integration, as well as to the provision of increasing functionality in a single-chip RF integrated circuit (IC) device.

However, the increasing density to which integrated RF circuit blocks are packaged in the same, or neighboring, integrated circuit devices has been attended by a number of operational challenges. Prominent among them is an aggravated susceptibility to electromagnetic interference (EMI) that may be propagated between circuits and devices. For example, with respect to densely packaged integrated circuit devices, and with respect to RF integrated circuits in particular, a current circulating in one loop in a device, or on a circuit board, may induce an interfering voltage at the input of another circuit or device. The likelihood of interference is exacerbated when the circulating current is an RF current that propagates to a circuit that is required to accept signals at the frequency of the EMI.

Conventionally, an interfering voltage may be reduced by one or more of the following methods: minimizing the loop area of either the transmitting or the receiving loop, increasing the distance between the transmitting and receiving loops, or shielding either or both the transmitting or the receiving loop. In the situation where an integrated circuit may be part of the receiving loop, it may be impracticable either to further minimize loop area or to provide shielding as a mechanism to reduce the induced interference. That is, the input loop of an integrated circuit consists essentially of a lead frame, having substantially fixed dimensions, and bond wires connecting the lead frame to the integrated circuit die. The dimensions and overall area of this part of the input loop are tightly controlled and fixed, but may not be reduced to zero. Furthermore, standard IC packaging does not provide even minimally effective shielding for this part of the input loop.

Accordingly, what is desired is a technique to improve the immunity of a receiving (IC) device from interfering signals that may arise in the proximity of the device.

SUMMARY OF THE INVENTION

The subject magnetically differential input circuit effects substantial reduction in the vulnerability of receiving circuits, such as, for example, integrated transceivers, to interference that emanates from other circuits in the vicinity. The input circuit establishes two loops between a signal source and the input of the receiving circuit. The loops operate in opposition across the input to the receiving circuit so as to effect cancellation of induced interfering signals.

In one embodiment, a magnetically differential input circuit couples a single-ended signal source to a single-ended receiving circuit. The input circuit comprises a first terminal to coupled to an output of the single-ended signal source; a second terminal to couple to a signal return; and a third terminal to couple to an output of the single-ended signal source. A first loop comprises the first terminal and the second terminal; a second loop comprises the second terminal and the third terminal.

In a further embodiment, a magnetically differential input circuit couples a source of differential signals to a differential receiving circuit. The input circuit comprises a first terminal to couple to a first output of the source of differential signals; a second terminal to couple to a second output of the source of differential signals; a third terminal to couple to the first output of the source of differential signals; an input node; a return node; a first conductor coupled to the first terminal and the input node; and a second conductor coupled to the first terminal and the input node. The terminals, circuit nodes and conductors are arranged to form a first loop and a second loop that effect cancellation of an induced interfering voltage at the receiving circuit.

In accordance with a still further embodiment, the input circuit is both magnetically and electrically differential and comprises a first input node to couple to a first polarity signal from the signal source; a second input node to couple to a second polarity signal from the signal source; a first terminal coupled to the first input node; a second terminal coupled to the second input node; a third terminal coupled to the first input node; and a fourth terminal coupled to the second input node. The first terminal and the fourth terminal are included in a first loop, and the second terminal and the third terminal are included in a second loop that opposes the first loop with respect to interfering signals.

In another embodiment, an integrated receiver comprises an amplifier and a magnetically differential input circuit to couple the amplifier to a source of signals. The input circuit comprises a first loop and a second loop, wherein the first loop traverses an amplifier input in a manner that opposes the second loop.

BRIEF DESCRIPTION OF THE DRAWINGS

The subject magnetically differential input may be better understood by, and its many features, advantages and capabilities made apparent to, those skilled in the art with reference to the Drawings that are briefly described immediately below and attached hereto, in the several Figures of which identical reference numerals (if any) refer to identical or similar elements, and wherein.

Figure 1:
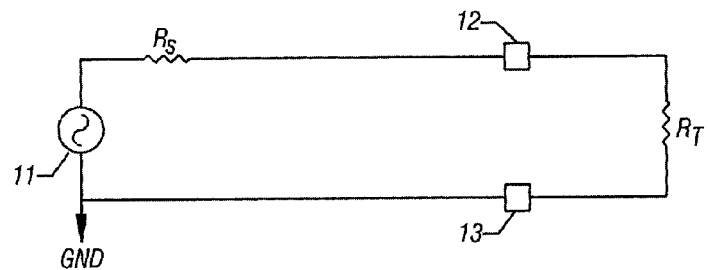
FIG. 1 is a circuit diagram of a conventional single-ended input loop.

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements to promote and improve understanding of embodiments of the invention.

DETAILED DESCRIPTION

For a thorough understanding of the subject invention, reference may be had to the following Detailed Description, including appended Claims, in connection with the above-described Drawings.

In one embodiment, a magnetically differential input circuit couples a signal source to the input of a receiving circuit, which may be, for example a low-noise amplifier (LNA) in an integrated receiver. The magnetically differential input circuit effects two circuit loops, each of which traverses the input to the receiving circuit. The loops are magnetically differential, in at least the sense that an interfering source or circuit induces opposing voltages in the loops. As a result, the interference is cancelled, or at least substantially attenuated, at the input of the receiving circuit. In an alternative embodiment, the input circuit may be arranged to be both magnetically and electrically differential. In FIG. 1, the integrated receiver is represented by terminals 12 and 13, (which in practice may be pins on an IC package) and by terminating impedance.

FIG. 1 illustrates a canonical form of a circuit to couple a single-ended signal source 11 to a receiving circuit in the form, for example, of an integrated receiver. In one application, signal source 11 may be an antenna that intercepts an RF signal and couples the RF signal to the single-ended input of the integrated receiver. Signal source 11 may be coupled between a first (positive) terminal 12 and a second (negative) terminal 13 on the integrated receiver. Signal source 11 is characterized by a source impedance, $R_s$. A terminating impedance, $R_T$, is presented across terminals 12 and 13 of the receiving circuit. In RF applications, particularly, the impedance presented by $R_T$ may be designed to match $R_s$. (As is well known, if the signal source presents an impedance that is not purely resistive, then sound design practice suggests that the receiving circuit should present a terminating impedance that is the conjugate match of the source impedance). As indicated above, interfering signals in the vicinity of terminals 12 and 13 may have the capacity to induce interfering signals (e.g., voltages) across terminals 12 and 13 in a manner that contaminates the intended input signal. The interfering signal may likely result in spurious responses or other anomalies in the processing of the intended input signal by the receiving circuit. In one embodiment, the deleterious effect of interfering signals may be substantially abated with resort to the magnetically differential input circuit depicted in FIG. 2.

Figure 2:
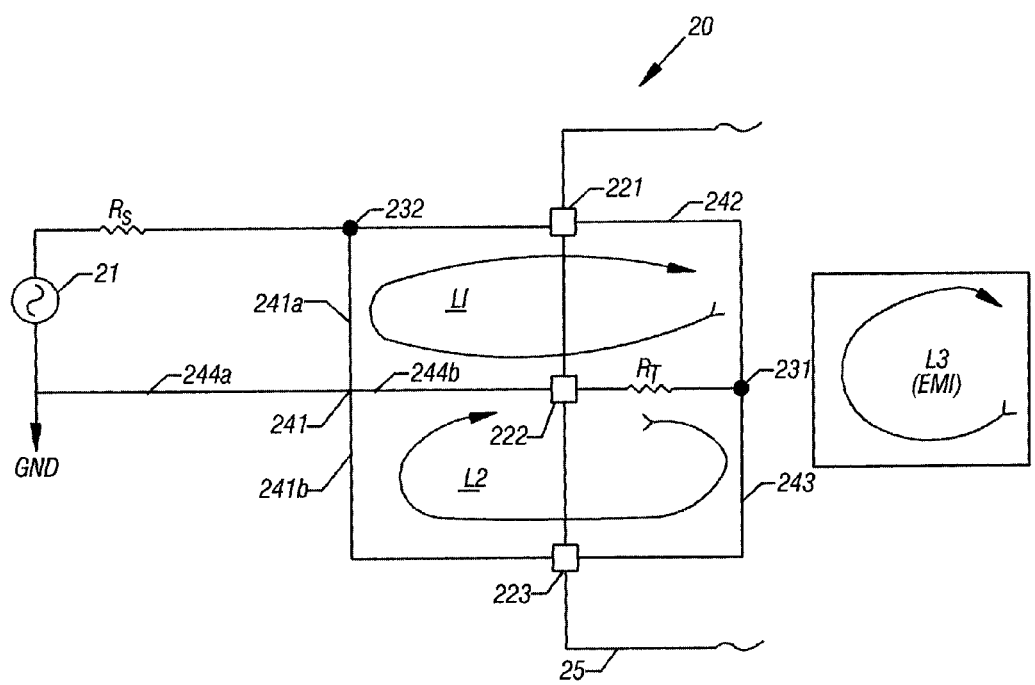
FIG. 2 is a circuit diagram of a magnetically differential input circuit to couple a single-ended signal source to a single-ended receiving circuit.

Referring now to FIG. 2, a single-ended signal source 21 is coupled at one end to a signal ground (GND) and at another end through a source impedance $R_s$ to input terminals 221 and 222. For purposes of this Detailed Description, GND may represent (and comprises) a physical ground connection, a virtual ground, or a common mode at low impedance at signal frequencies of interest. A terminating impedance $R_T$ is coupled between an input node 231 and terminal 222. In one embodiment, $R_T$ may be the input impedance of the receiving circuit coupled to node 231. Alternatively, $R_T$ may be a fixed resistor, or the combination of a fixed resistance with the input resistance of the receiving circuit, that is provided to match the source impedance, $R_s$, of signal source 21.

In addition, it may be seen from FIG. 2 that magnetically differential input 20 comprises a third 223 terminal that is coupled to a node 232 through a conductor 241. Conductor 241 comprises a first segment 241a and a second segment 241b. In an embodiment, terminal 221 may be considered a first positive terminal and terminal 223 a second positive terminal. It follows directly, therefore, that terminal 222 be considered a negative terminal (These designations are, clearly, somewhat arbitrary.) In addition, input circuit 20 comprises a conductor 242 that couples terminal 221 to input node 231 and comprises a conductor 243 that couples node 231 to terminal 223. A conductor 244, comprising segments 244a and 244b, couples the GND side of source 21 to terminal 222.

In a manner that is clearly discernable from FIG. 2, a magnetically differential input stage is constructed in a manner that forms two circuit loops, L1 and L2. Consistent with FIG. 2, circuit loop L1 comprises terminal 221, conductor 242, node 231, $R_T$, terminal 222, segment 244b of conductor 244, and first segment 241a of conductor 241. Similarly, circuit loop L2 comprises terminal 222, $R_T$, node 231, conductor 243, terminal 223, and second segment 241b of conductor 241.

In one embodiment, input circuit 20 may, as suggested above, constitute a part of an integrated circuit device, such as an integrated RF transceiver, for example. In this context, then, terminals 221, 223 and 223 may be pins on a package 25 that encloses the integrated RF transceiver. In this regard, some or all of the conductors 241, 242, 243 and 244 may reside within the IC device. In a manner known to practitioners, conductors, or conductor segments included in the IC device may be formed by one or more levels of metallization. Conductors, or conductor segments, that are external to package 25 may be formed by conductive traces imprinted on a printed circuit board (PCB). In some instances vias or plated-through hole with be employed were conductor paths intersect and no electrical interconnection is desired. Understand, however, that unless expressly so stated, the invention is not limited by the manner in which the conductors alluded to above are fabricated, or by the extent to which the conductors are enclosed within, or are extend outside, package 25.

The salient aspect of magnetically differential input circuit 20 derives from the mutual arrangements of loops L1 and L2. Specifically, loop L1 and L2 are constructed and arranged so that in the presence of an interfering loop L3, the interfering signal (e.g., voltage) induced in L1 by L3 is equal, but opposite, of the interfering signal induced in L2 by L3. That is, loops L1 and L2 traverse the input (effectively appearing across $R_T$) of the integrated receiver in opposite directions. Note that with respect to (N) terminal 222, (P) terminal 221 of loop L1 is positioned in a diametrically opposed orientation with respect to (P) terminal 223 of loop L2. The desired consequence of the aforementioned arrangement is that the induced interfering signal induced in L1 tends to cancel the interfering induced signal in L2. The degree to which this cancellation approximates completeness is a function of the extent to which L1 physically matches L2. For example, the cancellation effect is enhanced according to the extent that the geometries of L1 and L2 are matched, as well as the extent to which the proximities of the two loops interfering loop L3 are matched. Accordingly, in one embodiment, the area circumscribed by L1 is substantially equal to the area circumscribed by L2. Furthermore, to the extent practicable, L1 and L2 are juxtaposed at respective positions that are equidistant from interfering loop L3. In embodiments where terminals 221, 222 and 223 constitute pins on an IC device package, then to the extent that those pins are mutually adjacent in the manner suggested by FIG. 2, then the pins will likely be collinear, with pins 221 and 223 positioned diametrically opposite, and equidistant, from pin 222.

Figure 3:
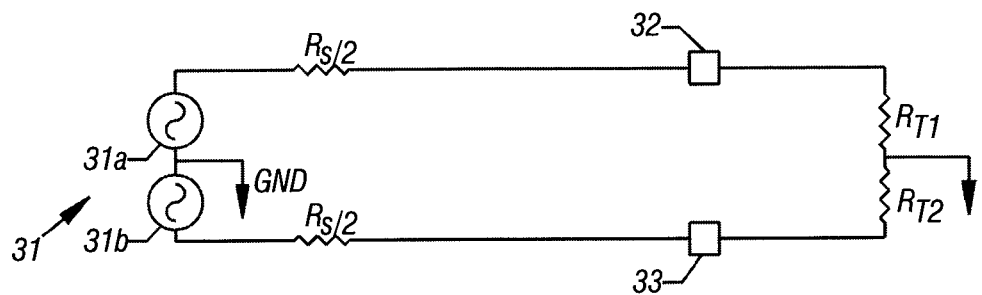
FIG. 3 is a simplified circuit diagram representing a conventional approach to coupling a differential signal source to a differential receiving circuit.

FIG. 2 represents an embodiment in which the magnetically differential input circuit couples a single-ended receiving circuit. FIG. 3 is simplified representation of a circuit in which a differential signal source is coupled to a differential input of a receiving IC device. In FIG. 3, a differential signal source 31 is represented by dual signal sources 31*a* and 31*b*. Signal sources 31*a* and 31*b* provide respective signals of equal magnitude, but opposite polarity, to the receiving IC device. That is, the signal provided by source 31*a* bears a 180° phase relationship to the signal provided by source 31*b*. Signal source 31*a* is coupled at one end to signal ground (GND) and at the opposite end through a source impedance $R_s/2$ to an input terminal 32. Similarly, signal source 31*b* is coupled at one end to GND and at the opposite end through a source impedance $R_s/2$ to input terminal 33. Input terminal 32 may be viewed as the positive (P) input terminal; and input terminal 33 may be viewed as the negative (N) input terminal. The differential input to the receiving IC device is represented as terminating resistances $R_T$ and $R_{T2}$, where $R_{T1}=R_{T2}=(R_s/2)$. $R_{T1}$ is coupled from (P) terminal 32 to GND; and $R_{T2}$ is coupled from (N) terminal 33 to GND. A magnetically differential input may be effect from an arrangement of FIG. 3 in the manner disclosed in FIG. 4.

Figure 4:
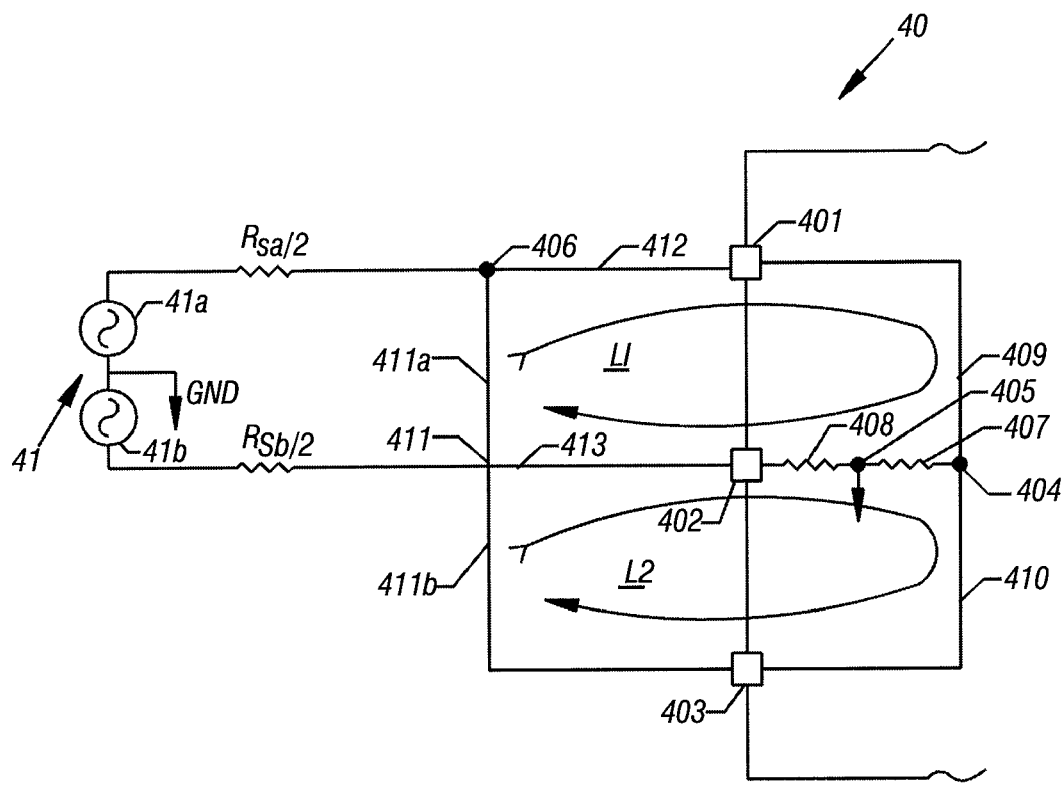
FIG. 4 is a circuit diagram of an embodiment of a magnetically differential input circuit to couple a differential signal source to a differential receiving circuit.

Referring now to FIG. 4, depicted therein is a magnetically differential input circuit 40 that is designed to couple a differential signal source 41 to a receiving integrated circuit device (not shown). In FIG. 4, differential signal source 41 is represented by dual signal sources 41*a* and 41*b*, that provide signals of equal magnitude, but opposite polarity to the receiving integrated circuit device. That is the signal provided by source 41*a* has a 180° phase relationship to the signal provided. Signal source 41*a* is coupled at one end to GND and at the opposite end through a source impedance, $R_{sa}/2$, to an input terminal 401. As a practical matter, $(R_{sa}/2)$ is coupled to terminal 401 through a conductor 406 that extends from a common node 406 to terminal 401. Similarly, signal source 41*b* is coupled at one end to signal ground at the opposite end through a source impedance, represented in FIG. 4 as $R_{sb}/2$, to an input terminal 402. As a practical matter $R_{sb}/2$ is coupled to terminal 402 through a conductor 413.

In a manner well understood by skilled practitioners, the differential input to the receiving integrated circuit device appears between an input node 404 and terminal 402. Input node 404 is, in turn, coupled to terminal 401 through a conductor 409 and is coupled to terminal 402 through a conductor 403. A terminating impedance to signal source 41 is provided by a first terminating impedance 407, represented in FIG. 4 as resistance $(R_T/2)$, and a second terminating impedance 408, also represented in FIG. 4 as a resistance $(R_T/2)$. Terminating impedance 407 is coupled between input node 404 and a return node 405. Terminating impedance 408 is coupled between return node 405 and terminal 402. A conductor 411, comprising a first segment 411*a* and a second segment 411*b*, couples terminal 403 to node 406.

In a manner that is clearly discernible from FIG. 4, a magnetically differential input stage 40 is constructed in a manner that forms two opposing circuit loops, L1 and L2. Consistent with FIG. 4, circuit loop L1 comprises conductor 412, terminal 401, conductor 409, input node 404, terminating impedance 407, return node 405, terminating impedance 408, terminal 402, conductor 413, and conductor segment 411*a*. Similarly, circuit loop L2 comprises conductor 413, terminal 402, terminating impedance 408, return node 405, terminating impedance 407, input node 404, conductor 410, terminal 403, and conductor segment 411*b*.

The salient aspect of magnetically differential input 40 derives from the mutual arrangements of loops L1 and L2. Specifically, loop L1 and L2 are constructed so that in the presence of an interfering loop L3, the interfering signal (e.g., voltage) induced in L1 by L3 is equal, but opposite, to the interfering signal induced in L2 by L1. That is, with respect to (N) terminal 402, terminal 401 of loop L1 is positioned in a diametrically opposed orientation with respect to terminal 403 of loop L2. The desired consequence of the aforementioned arrangement is that the induced interfering signal in L1 tends to cancel the induced interfering signal in L2. The degree to which this cancellation effect approximates completeness is a function of the extent to which L1 physically matches L2. For example, the cancellation effect is enhanced according to the extent that the geometries of L1 and L2 are matched, as well as the extent to which the proximities of the two loops interfering loop L3 are matched.

Without derogation to the effectiveness of the configuration of FIG. 4 in the abatement of EMI effects, it is instructive to note that although input circuit 40 of FIG. 4 is magnetically differential, it is nonetheless not electrically differential, in at least the sense that signal source 41*a* is coupled, through a source impedance $R_{sa}/2$ to input terminal 401, as well as to input terminal 403. More definitively, signal source 41*a* is coupled through $R_{sa}/2$ to node 406. Node 406 is coupled through conductor 412 to terminal 402 and is coupled through conductor 411 to signal source 41*b* is coupled only through a source impedance $R_{sb}/2$ and conductor 413 to terminal 402.

Figure 5:
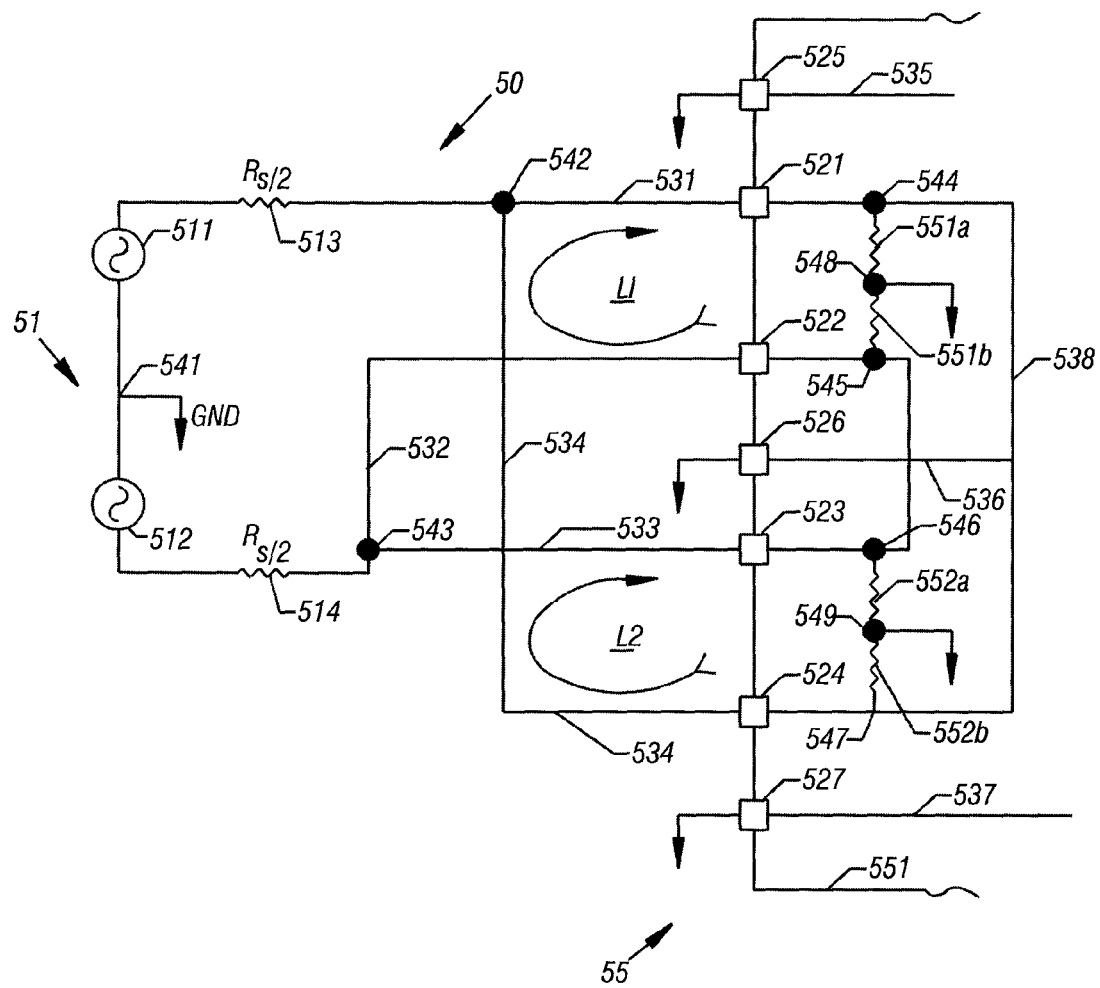
FIG. 5 is a circuit diagram of an input circuit to effect magnetically and electrically differential coupling from a differential signal source to a differential receiving circuit.

Consequently the load capacitance presented to source 41*a* will be roughly twice load capacitance presented to source 41*b*. That is signal source 41*a* is coupled to two pins on an integrated circuit device, whereas signal source 41*b* is coupled to a single pin or the integrated circuit device. Note that a second (dummy) pin may be coupled to source 41*b*, so that substantially equal load capacitances are presented to both source 41*a* and 41*b*. However, terminals 401 and 403 in that instance would continue to experience coupling to respectively adjacent terminals on the IC package. Because terminal 402 and the hypothesized dummy terminal would not experience such adjacent-terminal coupling, circuit 40 would not be rendered electrically differential. FIG. 5 depicts an input circuit arrangement that results in symmetrical (electrical) coupling, so that the input circuit is both magnetically and electrically differential.

Referring now to FIG. 5, depicted therein is a magnetically and electrically differential input circuit 50 that is designed to couple a differential signal source 51 to a receiving integrated circuit device 55. For purposes of this Description, integrated circuit 55 may be understood to be included in a device package 55 that includes internal circuitry (not shown) and a number of pins or terminals. In FIG. 5, differential signal source 51 is represented by dual signal sources 511 and 512 that provide signals of equal magnitude, but opposite polarity (i.e., relative phase shift=180°), to the receiving integrated circuit device. Signal source 511 is coupled at one end to signal ground (GND) and at the opposite end through a source impedance 513 $R_s/2$, to a first input node 542. Similarly, signal source 512 is coupled at one end to signal ground (GND) at the opposite end through a source impedance 512

($R_s/2$) to a second input node 543. Input node 542 may be viewed as being coupled to a first polarity (e.g., positive polarity) signal source 511. Input node 543 may be viewed as being coupled to a second polarity (e.g., negative polarity) signal source 512. Of course, in practical implementation, signal sources 511 and 512 represent the differential (opposite polarity) outputs of signal source 51.

First (positive) input node 542 is coupled through a conductor 531 to terminal 521 and through a conductor 534 to a terminal 524. Second (negative) input node 543 is coupled through conductor 532 to terminal 522 and through conductor 533 to terminal 523. A first terminating impedance 551, is coupled between terminal 521 and terminal 522. Terminating impedance 551 comprises a resistance 551a coupled between terminal 521 and GND and compares resistance 551b coupled between GND and terminal 522. A second terminating impedance 552 is coupled between terminal 523 and terminal 524. Terminating impedance 552 comprises a resistance 522a coupled between terminal 523 and GND and comprises a resistance 552b coupled between GND and terminal 524. Conductor 538 couples terminal 521 to terminal 524.

As may be seen from FIG. 5, the arrangement described above effects a first circuit loop L1 that comprises positive input node 542, conductor 531, terminal 521, terminating impedance 551, terminal 522, and conductor 532. A second circuit loop L2 comprises negative input node 543, conductor 533, terminal 523, terminating impedance 522 terminal 524, and conductor 534. As with the circuit arrangements of FIG. 2 and FIG. 4, the arrangement depicted in FIG. 5 results in a configuration such that, with respect to common source of EMI from an extraneous circuit loop L3 (not shown), L1 is oriented opposite to (i.e., opposes) L2, thereby effecting the cancellation of induced interfering signals at input of the receiving integrated circuit device.

Insofar as described immediately above, input circuit 50 is effective to present a magnetically differential input to a receiving integrated circuit device. However, although magnetically differential, it may be demonstrated that input circuit 50 is, nonetheless, not electrically differential.

Consider here the distinction between a magnetically differential input and an electrically differential an input. If it is assumed that the input (to a receiving device, for example) consists of a positive input, P, and a negative input, N, then the effective input is (P−N). To say that an input is magnetically differential implies that an interfering magnetic field will affect both the positive and negative inputs equally, so that subtracting (N) from (P) cancels the effect of the interfering magnetic field. The interfering magnetic field is created from, for example, currents in the chip, bond wires, package or board traces, and so forth.

To say that an input is electrically differential input implies that an interfering electric field will affect both the positive and negative inputs equally, so that subtracting (N) from (P) cancels the effect of the interfering electric field. THE interfering electric field is created from, for example, capacitive coupling in the chip, bond wires, package or board traces, and so forth.

The significance what the magnetic and the electric effects are independent. Electrically differential inputs only minimize electrical interference; magnetically differential inputs only minimize magnetic interference. A magnetically and electrically differential input tends to minimize the effects of both types of interference.

Returning attention to FIG. 5, it may be seen there that input circuit 50 is without more, not electrically differential. This is true because, at least, magnitude of the capacitive coupling to positive terminals 521 and 524 differs from the magnitude of the capacitive coupling to negative terminals 522 and 523. The inclusion of terminal 523 effects a capacitive loading on signal source 511 that is substantially equal to the capacitive loading on signal source 512. That is, the sum of the capacitive loads presented by terminals 521 and 524 to node 542 is substantially equivalent to the sum of the capacitive loads presented by terminals 522 and 523 to node 543. However, because terminals 521 and 524 are disposed at the endpoints of the linear string of terminals (521, 522, 523, and 524), terminals 521 and 524 experience coupling to adjacent terminals (not shown) on the device package. Interior terminals 523 and 524 are not subject to this form of coupling.

In one embodiment, input circuit 50 may be arranged to become electrically differential through the inclusion of additional conductive elements disposed in proximity with respective ones of terminals 521, 522, 523, and 524. Those conductive elements, which include, in one embodiment, terminals 525, 526, and 527 and include associated conductors 535, 536 and 537, form a coupling mechanism for balancing the coupling to terminals 521, 522, 523 and 524 by external circuits and/or signals.

As depicted in FIG. 5, the coupling mechanism includes terminal 526 disposed intermediate terminals 522 and 523. Note that terminals 522 and 523 are the terminals coupled to signal source 512. Terminal 526 is coupled to GND. A conductive trace 536 extends laterally from terminal 526 and, preferably, occupies a path equidistant loop L1 and loop L2. The coupling mechanism also includes terminal 525 disposed adjacent and above terminal 521. A conductive trace 535 extends laterally from terminal 525 along the upper boundary of loop L1. Terminal 525 is coupled to GND. Similarly, the coupling mechanism includes terminal 527 disposed adjacent and below terminal 524. Terminal 527 is coupled to GND. A conductive trace 537 extends laterally from terminal 527 along a lower boundary of loop L2. In one embodiment, conductive traces 535, 536 and 537 are of sufficient length to extend a distance from respective terminals 5225, 526, and 527 that is at least as great as the distance at which conductor 538 extends horizontally from terminals 521 and 524.

At this point it instructive to specifically indicate the salient aspects of the physical arrangement of input circuit 50 that enables circuit 50 to be considered magnetically differential as well as electrically differential. Here it is important to reiterate that, in one embodiment, terminals 525, 521, 522, 526, 523, 524 and 527 may represent contacts, or pins, on the package of an integrated circuit device (not shown). (In one embodiment, the integrated circuit device may implement an RF transceiver, for example.) Consequently, the dimensional separation between mutually adjacent terminals is substantially equal. That is, the distance between 521 and terminal 522 is equal to the distance between terminal 522 and terminal 526, inasmuch as these pairs of terminals are respectively mutually adjacent, and the pin spacing t on the device package is assumed to be uniform.

However, to the extent that uniform pin spacing on the device package is not obtainable (or is contraindicated for reasons not related to those addressed herein), then the following physical relationships are nonetheless preferably maintained. The physical separation between terminal pair 521 and 522 should be equal to the physical separation between terminal pair 523 and 524. This requirement derives from the desirability to establish equal areas for loop L1 and loop L2. In addition, to achieve electrically differential operation, terminal 526 should be equidistant between terminals 522 and 523, and terminal 525 should have the same physical separation from terminal 521 as does terminal 527 from terminal 524.

Accordingly, there has been disclosed herein a circuit arrangement that effects a magnetically differential input, from either a single-ended or differential signal source, to an integrated receiving device. As a result of the magnetically differential input, which establishes opposing loops that traverse the input of the receiving device, susceptibility to EMI contamination is substantially reduced. In a further embodiment, the magnetically differential input is rendered electrically differential as well as magnetically differential.

While the present invention has been described with respect to a limited number of embodiments, those skilled in the art will appreciate numerous modifications and variations therefrom. It is intended that the appended claims cover all such modifications and variations as fall within the true spirit and scope of this present invention.

I claim:

1. An integrated receiver comprising:
   an amplifier; and
   a magnetically differential input circuit coupled to the amplifier, and including a first loop having a first terminal to receive a signal from a signal source and a second terminal to couple to a signal ground, a second loop having a third terminal to receive the signal from the signal source and the second terminal, wherein the first and second loops are arranged so that a first interfering signal induced in the first loop by an interference source is cancelled by a second interfering signal induced in the second loop by the interference source, and a third loop within the integrated receiver, wherein the first interfering signal and the second interfering signal are induced by the third loop.

2. The integrated receiver of claim 1, wherein the first terminal is to couple to an output of a single-ended signal source.

3. The integrated receiver of claim 2, wherein the first loop and the second loop circumscribe substantially equal areas.

4. The integrated receiver of claim 1, wherein the input circuit comprises:
   the first terminal to couple to a first output of a source of differential signals;
   the second terminal to couple to a second output of the source of differential signals;
   the third terminal to couple to the first output of the source of differential signals;
   an input node;
   a return node;
   a first conductor coupled to the first terminal and to the input node; and
   a second conductor coupled to the first terminal and to the input node, wherein the terminals, circuit nodes and conductors are arranged to form the first loop and the second loop.

5. The integrated receiver of claim 4, wherein the first loop circumscribes a first area that is substantially equal to a second area circumscribed by the second loop.

6. The integrated receiver of claim 4, wherein the first loop comprises:
   the first terminal;
   the first conductor;
   the input node;
   the return node;
   the second terminal; and
   a first segment of a third conductor.

7. The integrated receiver of claim 6, wherein the second loop comprises:
   the second terminal;
   the return node;
   the input node;
   the second conductor;
   the third terminal; and
   a second segment of the third conductor.

8. The integrated receiver of claim 1, further comprising coupling means for causing the input circuit to effect electrically differential operation.

9. The integrated receiver of claim 8, wherein the input circuit comprises:
   a first input node to couple to a first polarity signal from the signal source;
   a second input node to couple to a second polarity signal from the signal source;
   the first terminal coupled to the first input node;
   the second terminal coupled to the second input node;
   the third terminal coupled to the first input node; and
   a fourth terminal coupled to the second input node, wherein the first terminal and the fourth terminal are included in the first loop and the second terminal and the third terminal are included in the second loop.

10. The integrated receiver of claim 9, wherein the coupling means is disposed in proximity to the first, second, third and fourth terminals to balance coupling to the first, second, third and fourth terminals.

11. The integrated receiver of claim 10, wherein the coupling means comprises a fifth terminal and a conductor disposed between the second terminal and the fourth terminal.

12. The integrated receiver of claim 11, wherein the coupling means comprises a sixth terminal and a conductor disposed in proximity to the first terminal.

13. The integrated receiver of claim 12, wherein the coupling means comprises a seventh terminal and a conductor disposed in proximity to the third terminal.

14. A receiver comprising:
   an antenna to receive radio frequency (RF) signals;
   an input circuit to couple the antenna to an input of an amplifier, the input circuit comprising:
      a first terminal to couple to an output of the antenna;
      a second terminal to couple to a signal ground;
      a third terminal to couple to the output of the antenna;
      a first loop comprising the first terminal and the second terminal; and
      a second loop comprising the second terminal and the third terminal,
   wherein the first loop and the second loop circumscribe substantially equal areas and are arranged so that a first interfering signal induced in the first loop by a source of interference is cancelled by a second interfering signal induced in the second loop by the source of interference; and
   the amplifier coupled to the input circuit.

15. The receiver of claim 14, wherein the first, second and third terminals are substantially collinearly juxtaposed and the second terminal is disposed intermediate between, and substantially equidistant from, the first terminal and the third terminal.

16. The receiver of claim 14, further comprising a third loop within an integrated circuit package including the amplifier, wherein the first interfering signal induced in the first loop by the third loop is to cancel the second interfering signal induced in the second loop by the third loop.

17. The receiver of claim 16, wherein the first, second and third terminals are pins on the integrated circuit package, the integrated circuit package including a transceiver.

18. The receiver of claim 17, wherein the first and second loops traverse an input of the transceiver in opposite directions.

19. The receiver of claim 14, wherein the first and third terminals are diametrically opposite and mutually adjacent to the second terminal.

* * * * *